United States Patent [19]
Nishida

[11] Patent Number: 5,279,686
[45] Date of Patent: Jan. 18, 1994

[54] SOLAR CELL AND METHOD FOR PRODUCING THE SAME

[75] Inventor: Shoji Nishida, Fujisawa, Japan

[73] Assignee: Canon Kabushiki Kaisha, Tokyo, Japan

[21] Appl. No.: 837,976

[22] Filed: Feb. 20, 1992

[30] Foreign Application Priority Data

Feb. 20, 1991 [JP] Japan .................................. 3-45586
Mar. 29, 1991 [JP] Japan .................................. 3-89338

[51] Int. Cl.$^5$ .................. H01L 31/0368; H01L 31/18
[52] U.S. Cl. ........................................ 136/258; 437/4
[58] Field of Search ...................... 136/258 PC; 437/4

[56] References Cited

U.S. PATENT DOCUMENTS 4,431,858 2/1984 Gonzalez ............................ 136/258
5,098,850 3/1992 Nishida et al. ......................... 437/4

FOREIGN PATENT DOCUMENTS 0276961 8/1988 European Pat. Off. ...... 136/258 PC
9101657 11/1991 PCT Int'l Appl. ........... 136/258 PC
9101745 12/1991 PCT Int'l Appl. ........... 136/258 PC

OTHER PUBLICATIONS

"Grain Growth Mechanism of Heavily Phosphorous-Implanted Polycrystalline Silicon" by Yasuo Wada et al., *Journal of the Electrochemical Society*, vol. 125, No. 9 Sep., 1978 pp. 1499-1504.

*Primary Examiner*—Aaron Weisstuch
*Attorney, Agent, or Firm*—Fitzpatrick, Cella, Harper & Scinto

[57] ABSTRACT

There is disclosed a polycrystalline silicon solar cell, utilizing a continuous polycrystalline silicon film consisting of single crystals grown from a plurality of small nucleation surfaces provided on a non-nucleation surface. The semiconductor junction, providing the photoelectromotive force of the solar cell, is formed on the single crystals, avoiding the areas of grain boundaries formed by mutual contact of the single crystals, in order to eliminate the drawbacks resulting from such boundaries. The semiconductor junction is formed by masking the areas of the grain boundaries with a suitable masking material, such as photoresist.

14 Claims, 10 Drawing Sheets

SOLAR CELL AND METHOD FOR PRODUCING THE SAME

BACKGROUND OF THE INVENTION

1. Field of the Invention

The present invention relates to a solar cell adapted for use as a power source for various electronic equipment or as a power source for power generating facilities, and more particularly a large-grain polycrystalline solar cell with a high energy conversion efficiency and with satisfactory mass producibility, and a method for producing such solar cell.

2. Related Background Art

Solar cells have been utilized as power sources for various equipment. Such solar cells include a p-n junction as the functional part, and the semiconductor constituting such p-n junction is generally silicon. Monocrystalline silicon is preferable in terms of efficiency for converting the light energy into electric power, but amorphous silicon is considered more advantageous in formation of large-area devices and in cost reduction. In recent years, there has been investigated the use of polycrystalline silicon, for the purpose of attaining a low cost, as with amorphous silicon, and a high energy conversion efficiency as with monocrystalline silicon. However, in the conventionally proposed method, utilizing plate-shaped materials obtained by slicing a block of polycrystal, it has been difficult to reduce the thickness of the device below 0.3 mm. Consequently, the device becomes excessively thicker than required for sufficient light absorption, and the material has not effectively been utilized. Thus, for cost reduction, formation of a sufficiently thin structure is essential.

For this purpose, there has been investigated the formation of a thin film of polycrystalline silicon by thin film forming technologies such as chemical vapor deposition (CVD), but such methods have only provided crystals with a grain size less then 1/10 micron, so that the energy conversion efficiency is even lower than that obtained with the plate sliced from a polycrystalline silicon block.

Also, there has been reported a so-called "abnormal grain growing method" (Yasuo Wada and Shigeru Nishimatsu, *Journal of Electrochemical Society*, Solid-State Science and Technology, 125 (1978) 1499) for expanding the grain size even in excess of 10 times the film thickness, by introducing atoms of an impurity such as phosphorus by ion implantation to a supersaturated state into the above-mentioned polycrystalline thin silicon film, formed by CVD, and then annealing said film at a high temperature. However, such film cannot be used as the active layer for generating the photocurrent because of the excessively high impurity concentration. Also, there has been an attempt to irradiate a polycrystalline thin silicon film with a laser beam, thereby enlarging the crystal grain size by fusion and recrystallization, but such method cannot achieve sufficient cost reduction and stable manufacture.

The above described situation exists not only with silicon but also with compound semiconductors.

On the other hand, a solar cell as shown in FIG. 3 can be obtained by forming, on a substrate surface, a different material having a nucleation density sufficiently higher than that of the material constituting the substrate surface and having a size sufficiently small for growing a single nucleus, then forming a substantially monocrystalline semiconductor layer of a first conductivity type on said substrate surface, including a step of forming a nucleus by deposition on said different material and growing a crystal from said nucleus, and growing, on said monocrystalline layer, a substantially monocrystalline semiconductor layer of a second conductivity type. Such polycrystalline solar cell has been shown to have a small thickness, a sufficiently large crystal grain size, and a high energy conversion efficiency.

Such solar cell and the method for producing the same are disclosed, for example, in the European Patent Office Laid-Open Application No. 0276961.

In a polycrystalline semiconductor, however, a number of crystal grain boundaries (hereinafter simply written as grain boundaries) are formed by many monocrystalline grains of different crystal orientations, and defect energy levels are formed in the forbidden band because of the presence of atoms with dangling bonds at such boundaries. The characteristics of the semiconductor device are closely related to the defect density of the prepared semiconductor layer, and the grain boundaries not only have the above-mentioned defect levels but also tend to induce segregation of impurities, both of which give rise to deterioration of the characteristics of the device. Therefore, with a polycrystalline semiconductor, the characteristics of the obtained device are generally considered to be significantly affected by control of the grain boundaries. More specifically, in order to improve the characteristics of a semiconductor device utilizing a polycrystalline semiconductor layer, it is effective to reduce the number of grain boundaries present in the semiconductor layer. In the method for forming the device shown in FIG. 3, the number of grain boundaries can be reduced by increasing the grain size. In this method, the first substantially monocrystalline layer is immediately covered by the second substantially monocrystalline layer, so that the solar cell is composed, as shown in FIG. 3, of a substrate 301, a silicide layer 302, an insulating layer 303, continuously formed polycrystalline silicon films 304, 305, a transparent conductive layer 306, all in a stacked structure, and a current collecting electrode 307. In such configuration, though the number of grain boundaries is reduced in comparison with that in an ordinary polycrystalline semiconductor of smaller gain size, certain grain boundaries 308 are still included at the junction, as such boundaries are inevitably formed at the contact of single crystals, each grown from a single nucleus formed on the small-sized different material constituting the nucleation surface. For this reason, the open circuit voltage of such a device based on a polycrystalline semiconductor is lower than that based on a monocrystalline semiconductor. Therefore, the conventional configuration based on polycrystalline silicon tends to show a high level of dark current resulting from recombination and a relatively low level of photocurrent.

Also, the p-n junction is usually formed in the vicinity of a light-receiving surface of the semi-conductor layer. In the case of a polycrystalline semi-conductor, active grain boundaries 203 in an n (or p) area 201 and a p (or n) area 202 are included in the p-n junction as shown in FIG. 2, thus causing recombination. Therefore the dark current increases significantly in comparison with that of a monocrystalline semiconductor, eventually leading to the deterioration of electrical characteristics, particularly a decrease in the open circuit voltage. Also, the presence of many grain boundaries deteriorates the photosensitivity, thus decreasing the photocurrent. For these reasons, the open-circuit voltage of an ordinary solar cell based on polycrystalline silicon has not exceeded 0.5 V unless certain measures, such as hydrogen passivation, are adopted.

SUMMARY OF THE INVENTION

An object of the present invention is to eliminate the above-mentioned drawbacks and to provide a solar cell of high quality, by reducing the influence of grain boundaries in polycrystalline semiconductors, through formation of a junction avoiding the grain boundaries.

Another object of the present invention is to provide an inexpensive solar cell by growing a polycrystalline silicon layer of a large grain size on a substrate such as a non-monocrystalline substrate.

Still another object of the present invention is to provide a method of satisfactory mass producibility for producing a polycrystalline solar cell, by forming a junction avoiding the grain boundaries and simultaneously passivating the grain boundaries.

DETAILED DESCRIPTION OF THE PREFERRED EMBODIMENTS

Now the present invention will be clarified in detail by preferred embodiments thereof shown in the attached drawings.

In a preferred embodiment of the present invention, there is provided a polycrystalline silicon solar cell utilizing single crystals grown by a selective crystal growing method from small nucleation surfaces provided on a non-nucleating surface, wherein the semiconductor junction generating a photoelectromotive force is so formed as to exclude the area of crystal grain boundaries formed by contact of said single crystals.

There is also provided a method for producing such polycrystalline silicon solar cell by a selective crystal growing method, comprising the steps of:

1) forming a non-nucleating surface and a plurality of small nucleation surfaces on a substrate;
2) generating and growing single the nucleation surface on said substrate by a selective crystal growing method, thereby obtaining a continuous polycrystalline film;
3) forming a semiconductor junction on a part of the single crystal surface, excluding the area of the crystal grain boundaries formed by contact of said single crystals; and
4) forming a transparent conductive layer and a current collecting electrode on said continuous polycrystalline film;

wherein said semiconductor junction is preferably formed by forming a masking material on said continuous polycrystalline film, forming apertures in part of said masking material, excluding the area of the grain boundaries, and introducing a dopant impurity through said apertures.

In another preferred embodiment, there is provided a method for producing a polycrystalline solar cell utilizing a selective crystal growing method, comprising the steps of:

1) forming a non-nucleation surface and a plurality of nucleation surfaces on a substrate;
2) generating single crystals by a selective crystal growing method solely on the nucleation surfaces on said substrate and growing said single crystals, thereby obtaining a continuous polycrystalline film;
3) forming, on said continuous polycrystalline a layer containing at least silicon, nitrogen, and hydrogen atoms, and having apertures excluding areas corresponding to the crystal grain boundaries formed by contact of said single crystals, and introducing a dopant impurity into the exposed surfaces of said single crystals through said apertures;
4) forming a semiconductor junction by heating the surfaces of said single crystals exposed by said apertures, and effecting passivation of said crystal grain boundaries with hydrogen atoms; and
5) forming a transparent conductive layer and a current collecting electrode on said continuous polycrystalline film.

Figure 4A:
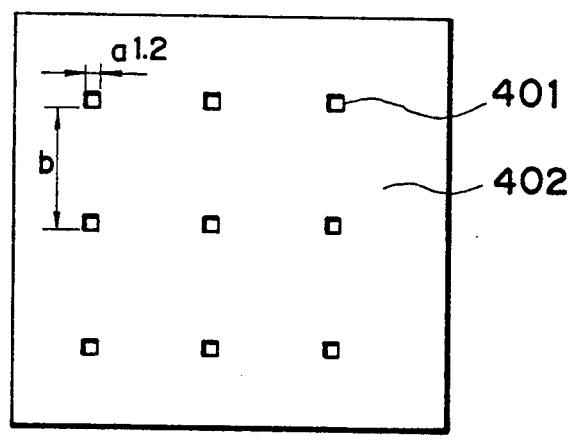
FIGS. 4A and 4B are respectively a plan view and a cross-sectional view, showing the method for forming polycrystalline silicon with defined grain boundary positions by selective crystal growth.
Figure 4B:
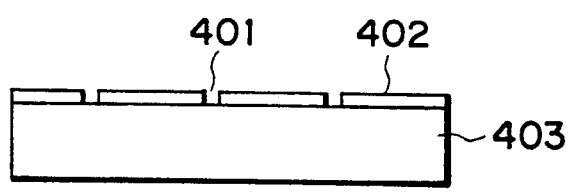
Figure 6A:
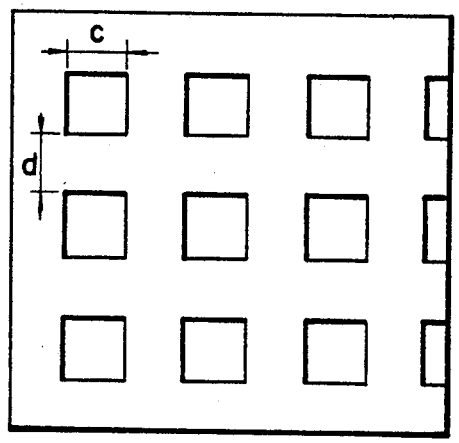
FIG. 6A is a view of a photomask employed in the method of the present invention.
Figure 6B:
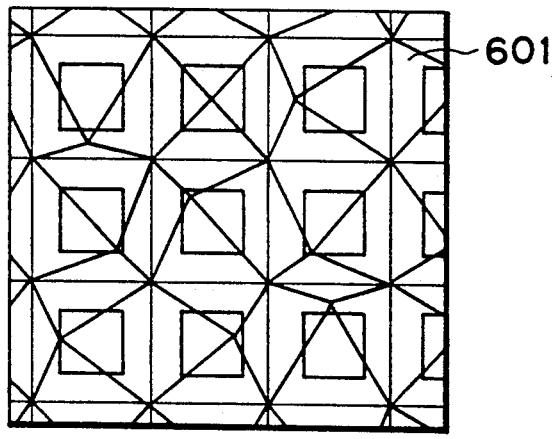
FIGS. 6B and 6C are respectively a plan view and a cross-sectional view showing the masked state of the grain boundaries, obtained by said photomask.
Figure 6C:
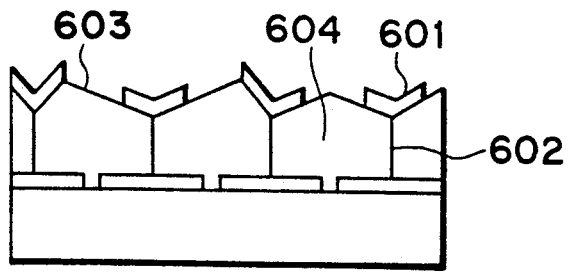

The principal technology of the present invention consists, as shown in FIGS. 4 and 6C, of forming a polycrystalline thin silicon film consisting of a group of single crystals 604 with uniform grain size and controlled position of the grain boundaries 602 by selective crystal growth utilizing a non-nucleation surface 402 and nucleation surfaces 401 formed on a substrate 403, forming a masking material 601 thereon, forming apertures 603 excluding the areas of the grain boundaries 602, and forming a junction through said apertures 603.

Said technology is also featured by the formation of the junction through dopant impurity introduction avoiding the position of grain boundaries, by controlling the position of the grain boundaries during the selective crystal growth and by introducing said dopant impurity after the formation of the hydrogen containing layer 601 containing at least silicon, nitrogen, and hydrogen atoms (hereinafter called "Si₃N₄ layer" since hydrogen containing Si₃N₄ layer is a representative example) and having apertures 603 excluding the areas of the grain boundaries 602.

In the polycrystalline silicon obtained, for example, by the ordinary CVD process, the position of the grain boundaries cannot be defined because the grain size is as small as 1 μm or even smaller, and is variable. It is therefore not possible to form the junction only on the crystal grains, excluding the areas of the grain boundaries. On the other hand, a method disclosed, for example, in the European Patent Office Laid-Open Application No. 027691 can control the positions of generation of single crystals and the variation in the grain size, so that the position of the grain boundaries can be defined. For example, by positioning the nucleation surfaces in a pattern of lattice points 401 as shown in FIGS. 4A, 4B, 5A, and 5B, there can be obtained a polycrystalline silicon film 501 with a large grain size and with grain boundaries formed in a checkerboard pattern. The apertures 603 can be formed, excluding the areas of the grain boundaries 602 as shown in FIGS. 6B and 6C, by coating said polycrystalline silicon film with photoresist, and effecting exposure with a photomask as shown in FIG. 6A and development of said photoresist. The junction can be formed excluding the areas of the grain boundaries 602, by introducing a dopant impurity, for example, by ion implantation into the thus masked polycrystalline silicon film 604, and activating said impurity by annealing after the stripping of the photoresist.

Alternatively, for example, SiO₂ may be formed as the masking material instead of the photoresist, on the surface 501 of the polycrystalline silicon shown in FIG. 5. In this case, the junction is formed by coating photoresist thereon, forming apertures therein by exposure and development utilizing the abovementioned photomask, excluding the areas of grain boundaries, etching SiO₂ through said apertures to expose the Si surface, and introducing a dopant impurity by ion implantation or thermal diffusion.

Figure 11:
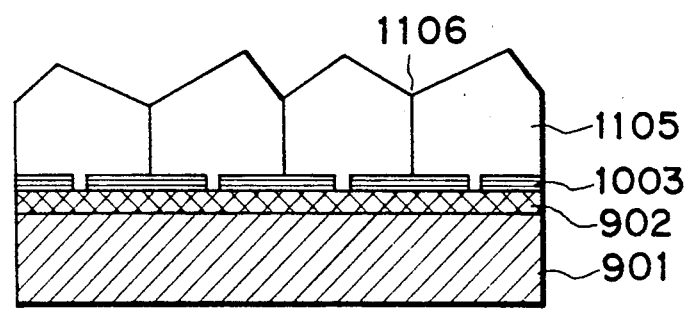
Figure 12:
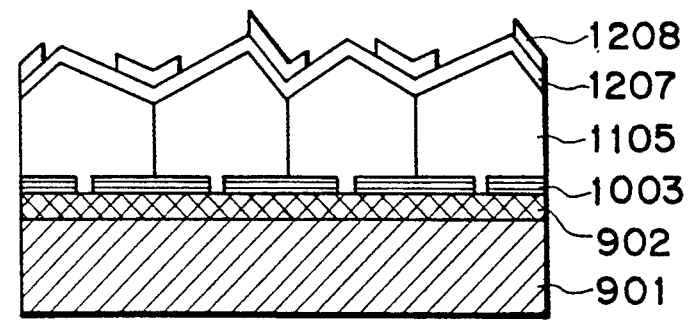

It is also possible to form the apertures 603, avoiding the areas of the grain boundaries 602 as shown in FIG. 6C, 11, and 12, after the formation of polycrystalline silicon, by depositing thereon hydrogen-containing Si₃N₄ 601 from a gaseous mixture of SiH₄ and NH₃ in a plasma CVD apparatus, coating photoresist thereon, and effecting exposure and development of said photoresist utilizing a photomask as shown in FIG. 6A.

It is also possible to achieve formation of a junction avoiding the areas of grain boundaries and passivation of such grain boundaries, by introducing a dopant impurity by ion implantation into the thus masked polycrystalline silicon film 1105 (FIG. 11) and annealing said film for a short period by radiant heating after the stripping of photoresist, thereby activating the dopant impurity and diffusing hydrogen atoms.

Said junction formation and passivation of the grain boundaries 1106 may also be achieved by depositing aluminum on the polycrystalline silicon layer 1105 by vacuum evaporation or paste application, instead of ion implantation, then lifting off said aluminum in unnecessary portions by stripping off the photoresist, and heating the silicon layer.

In the following, an embodiment of the present invention will be explained in greater detail.

Figure 8A:
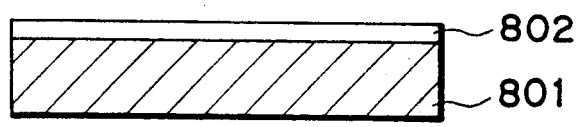
FIGS. 8A, 8B, 8C, 8D, 8E, and 8F are cross-sectional views showing steps for producing the solar cell of the present invention.

At first, as shown in FIG. 8A, a silicon layer is deposited on a metal substrate 801 in a vacuum evaporation apparatus or an LPCVD apparatus, and is annealed to obtain a silicide layer 802.

Figure 8B:
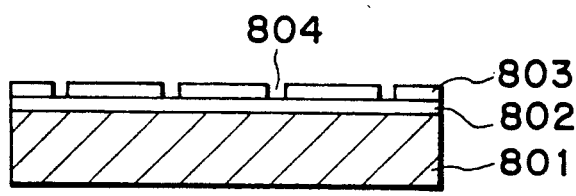

Then, as shown in FIG. 8B, an insulating layer 803 (for example an oxide film obtained by thermal oxidation or atmospheric pressure CVD) is formed on the silicide layer 802, and is photolithographically etched to form a lattice type array of regularly positioned small apertures therein, thus exposing the silicide surface which constitutes the nucleation surfaces 804.

Figure 8C:
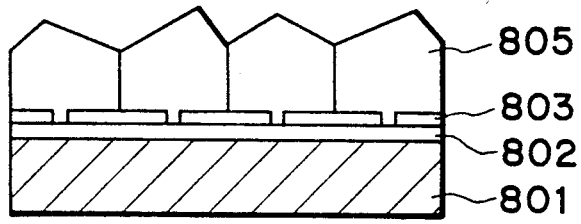
Figure 8D:
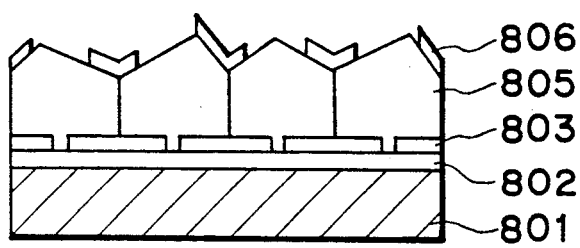
Figure 8E:
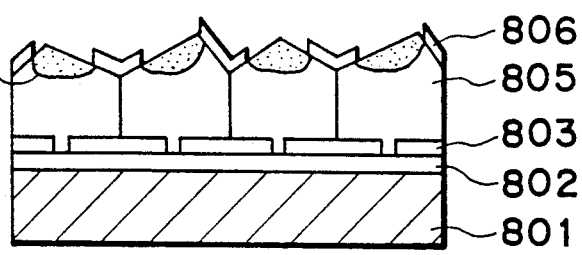
Figure 8F:
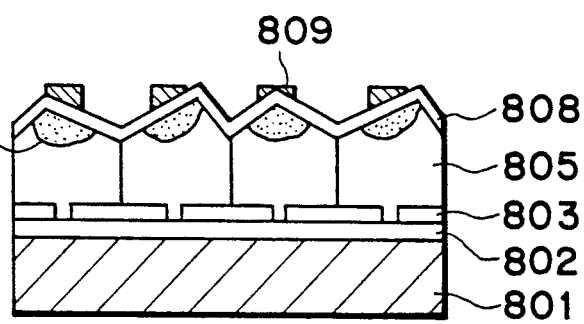
Figure 9:
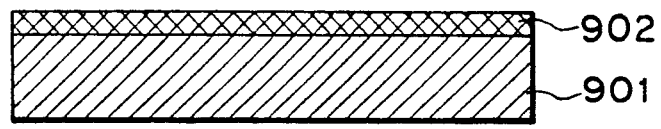
FIGS. 9, 10, 11, and 12 are schematic partial cross-sectional views showing embodiments of steps constituting the method of the present invention.
Figure 10:
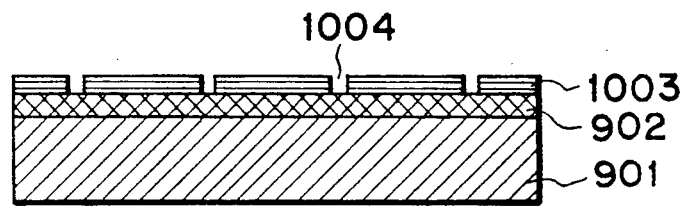

Then, as shown in FIGS. 8B and 8C, crystals are grown from the nucleation surfaces 804 by selective crystal growth and lateral overgrowth to obtain a continuous polycrystalline silicon film 805. Ohmic contact with the silicide layer may be achieved by introducing dopant impurity atoms (for example P for n type) at a high concentration by doping during the initial period of the crystal growth.

Then, as shown in FIGS. 11 and 12, a Si₃N₄ layer 1207 of a thickness of ca. 1 μm is deposited on the continuous polycrystalline film 1105 by a plasma CVD apparatus, then photoresist 1208 is coated thereon with a thickness of about 1 μm, and the areas 1106 of grain boundaries are masked by a photolithographic process employing a photomask as shown in FIG. 6A.

Figure 13:
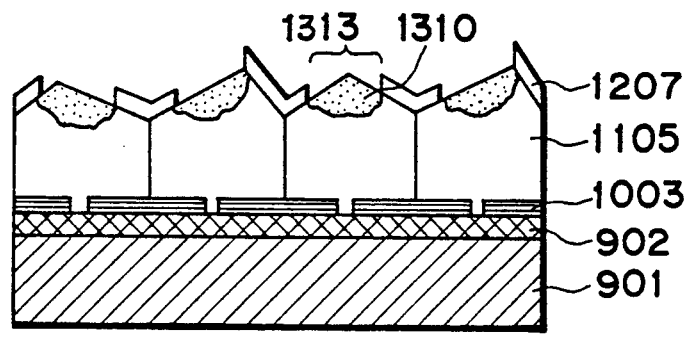
FIG. 13 is a cross-sectional view showing a state in which the grain boundaries are masked by $Si_3N_4$ in the method of the present invention.

Then, as shown in FIG. 13, the Si₃N₄ layer is removed by a RIE (reactive ion etching) apparatus in the areas not covered by the photoresist, thereby forming apertures 1313 in said layer. Then a dopant impurity is introduced by ion implantation through said apertures, and said layer is heated after photoresist stripping to form a p+ (or n+) layer 1310 on the crystal surface and to simultaneously passivate the crystal boundary areas 1106.

Figure 14:
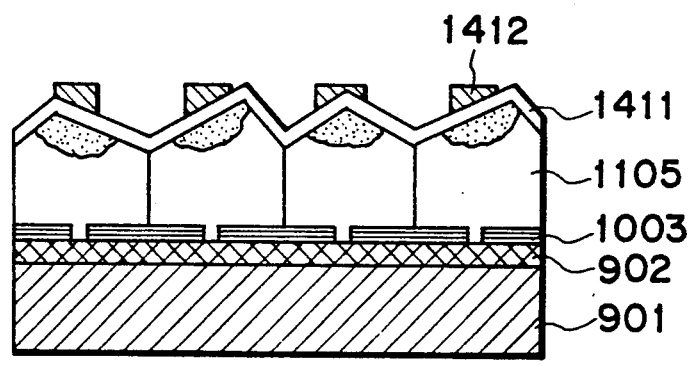
FIG. 14 is a schematic partial cross-sectional view showing an embodiment of a step of the method of the present invention.

Finally, the polycrystalline solar cell can be obtained, as shown in FIG. 14, by removing the remaining Si₃N₄ layer 1207 and thereafter forming a transparent conductive film 1411 and current-collecting electrodes 1412.

The substrate 901 employable for the solar cell of the present invention can be of any metal that has satisfactory conductivity and can form a compound with silicon such as a silicide, and representative examples of said metal include W, Mo, and Cr. Naturally, any other material having a metal of the above-mentioned properties at the surface thereof may be employed as said substrate, so that inexpensive non-metal substrates can also be employed. The thickness of the silicide layer 902 is not critical, but is preferably within a range from 0.01 to 0.1 μm.

Also the thickness of the insulation layer 1003 is not particularly defined, but is advantageously within a range from 0.02 to 1 μm. The grain size and thickness of the continuous polycrystalline silicon film 1105 are generally within a range of 10 to 500 μm in consideration of the requirements for the characteristics of the solar cell and the limitations of the process, and preferably within a range of 20 to 500 μm. Also, the thickness of the p+ layer 1310 is generally within a range of 0.05 to 3 μm, though it depends on the amount of the impurity to be introduced, and preferably is in a range from 0.1 to 1 μm. Examples of the impurity include P, As, Sb, B, Al, In, and Ga.

The insulating layer 1003, constituting the non-nucleation surface in the present invention, is composed of a material having a nucleation density considerably smaller than that of silicon, in order to suppress nucleation during crystal growth, and representative examples of such material include $SiO_2$ and $Si_3N_4$. There may also be employed metal oxides and silicides.

The selective crystal growth in the present invention can be achieved by LPCVD, plasma CVD, photo CVD, or liquid phase crystal growth. The method of the present invention can be executed not only in a batch process but also in a roll-to-roll process.

In the selective crystal growth by LPCVD in the present invention, examples of raw material gas include silanes and halogenated silanes such as $SiH_2Cl_2$, $SiCl_4$, $SiHCl_3$, $SiH_4$, $Si_2H_6$, $SiH_2F_2$, and $Si_2F_6$.

Hydrogen is added to the above-mentioned raw material gas, as carrier gas or for obtaining a reducing atmosphere which accelerates the crystal growth. The ratio of said raw material gas to hydrogen is suitably determined depending on the crystal growing process, raw material gas, insulation layer, and crystal growing conditions employed, but is preferably within a range from 1:10 to 1:1000 (in the ratio of introduced flow rates), and more preferably within a range from 1:20 to 1:800.

In the present invention, HCl is added for the purpose of suppressing nucleation on the insulation layer. The ratio of HCl to the raw material gas is suitably determined depending on the crystal growing process, raw material gas, insulation layer, and crystal growing conditions to be employed, but is preferably within a range from 1:0.1 to 1:100 and more preferably from 1:0.2 to 1:80.

The temperature and pressure for conducting the selective crystal growth in the present invention vary, according to the crystal growing process and conditions thereof, such as raw material gas and flow rate ratio of the raw material gas, $H_2$, and HCl. The temperature in the ordinary LPCVD process is generally in a range from 600° to 1250° C., and preferably in a range from 650° to 1200° C. The liquid phase employ Ga, In, Sb, Bi, or Sn as solvent, and, in case Sn is employed, the temperature is preferably controlled within a range from 850° to 1050° C. Also, in low-temperature processes such as a plasma CVD process, the temperature is generally within a range from 200° to 600° C., and preferably from 200° to 500° C.

Also, the pressure is generally within a range from $10^{-2}$ to 760 Torr, preferably from $10^{-1}$ to 760 Torr.

Dimensions c, d of the photomask (FIG. 6A) are not specifically defined, except for following the size of the single crystal to be grown, but the minimum width of c, d is preferably at least 1 μm in consideration of ordinary photolithographic performance and series resistance. In case $Si_3N_4$ is employed for passivation of the grain boundary areas, it is deposited by plasma decomposition of $SiH_4+NH_3$, and the concentration of hydrogen atoms contained in the film is desirably as high as possible in order to sufficiently terminate the grain boundaries with hydrogen atoms, and is preferably equal to $10^{22}$ cm$^{-3}$ or higher.

The heating method in the heating step 4) is not particularly limited, but radiant heating is preferred in order to substantially eliminate contamination from the heating means. For example, heating with a tungsten heater may cause contamination with W atoms, but in the radiant heating, the glass from the lamp prevents such contamination with W atoms.

In the following, the masking of grain boundaries is explained.

On a Mo substrate of a thickness of 500 μm, Si was deposited by evaporation to a thickness of ca. 300 Å, and a silicide layer was formed by heat treatment for 30 min. at 600° C. A $SiO_2$ insulating layer of a thickness of 1000 Å was formed thereon by an atmospheric pressure CVD method, and was photolithographically etched to form square apertures with a size of a=1.2 μm, arranged in a lattice pattern with a pitch b=50 μm, thereby exposing the silicide layer as nucleation surfaces 401. The $SiO_2$ layer constitutes the non-nucleation surface 402.

Figure 7:
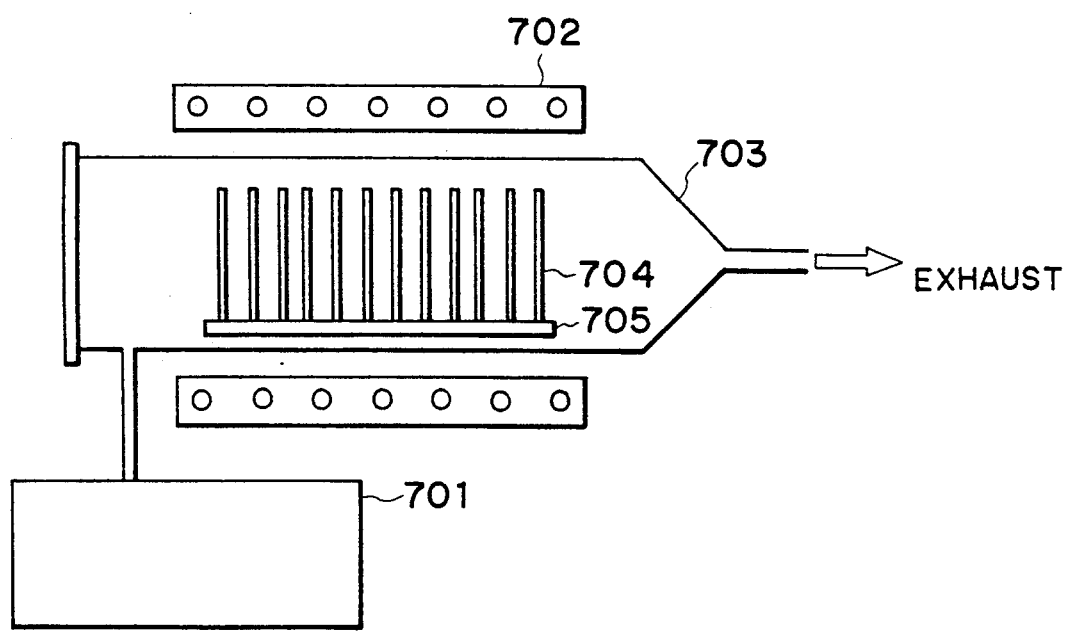
FIG. 7 is a schematic view of an LPCVD apparatus employed in the process for producing the solar cell of the present invention.

Then selective crystal growth was conducted by positioning a plurality of substrates 704 on a susceptor 705 of an ordinary low pressure CVD apparatus (LPCVD) as shown in FIG. 7, consisting of a quartz reactor tube 703 provided with a gas supply system 701 and a heater 702. The raw material gas consisted of $SiH_2Cl_2$, to which was added $H_2$ as the carrier gas and HCl for suppressing nucleation on the $SiO_2$ insulation layer. The crystal growing conditions employed are shown in Table 1.

TABLE 1

| Gas flow rate ratio | Substrate Temperature | Pressure | Growth Time |
|---|---|---|---|
| $SiH_2Cl_2/HCl/H_2$ = 0.53/2.0/100 | 1030° C. | 80 Torr | 120 min. |

Figure 5A:
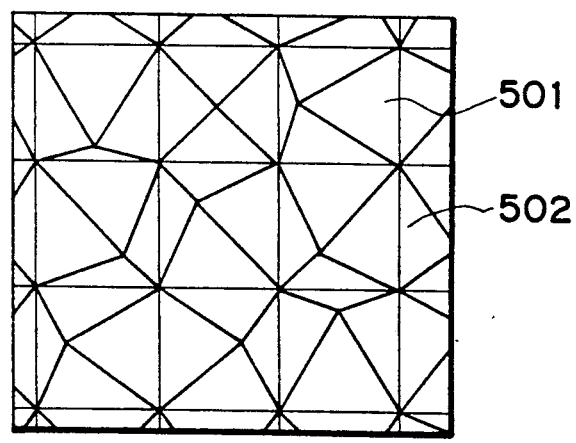
FIGS. 5A and 5B are respectively a plan view and a cross-sectional view, showing the method for forming polycrystalline silicon with defined grain boundary positions by selective crystal growth.
Figure 5B:
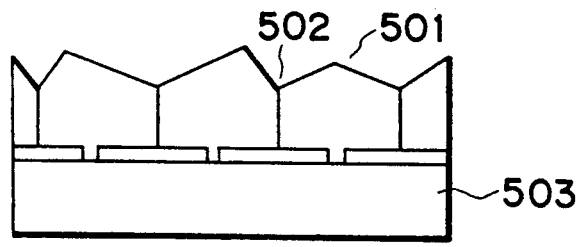

Observation of the substrate surface under an optical microscope after the crystal growth showed a regular arrangement of single crystals 501, each having peaked facets as shown in FIGS. 5A and 5B, at the lattice points with a pitch of 50 μm, indicating that the selective crystal growth was conducted according to the pattern of the above-explained nucleation surfaces. Consequently, the positions of the grain boundaries are simultaneously defined in a lattice pattern. Subsequently, photoresist was coated with a thickness of about 1 μm on the thus obtained polycrystalline layer consisting of single crystals, and was subjected to exposure and development with a photomask as shown in FIG. 6A (c=40 μm, d=20 μm) in such a manner that the apertures 603 thereof were not positioned on the areas of the grain boundaries 602, whereby there was obtained a polycrystalline surface on which the areas of grain boundaries alone were masked as shown in FIG. 6B. Also, $SiO_2$, or $Si_3N_4$ may be utilized as the masking material instead of photoresist. In the case of $SiO_2$, it may be formed, for example, by thermal oxidation as a thin layer of a thickness of 100–1000 Å on the surface of the polycrystalline layer consisting of single crystals. Then photoresist is coated thereon and is subjected to exposure and development with the above-mentioned photomask to form apertures. Then the $SiO_2$ is removed by wet or dry etching through said apertures, thereby exposing the silicon surface. In the case of $Si_3N_4$, gaseous mixture of $SiH_4$ and $NH_3$ was decomposed in the ordinary plasma CVD apparatus to deposit hydrogen-containing $Si_3N_4$ with a thickness of 1 μm on the polycrystalline surface consisting of single crystals. Then photoresist was coated thereon with a thickness of about 1 μm, and was subjected to exposure and development with a photomask (c=40 μm, d=20 μm) to form apertures in such a manner that they do not overlap with the areas of the grain boundaries. $Si_3N_4$ was removed by wet or dry etching through said apertures in the photoresist, thereby exposing the silicon surface. A polycrystalline surface on which the grain boundaries alone were masked could be obtained in this manner.

Said photoresist was removed with stripper after dopant impurity introduction. The apertures can also be formed without the photomask. At the photoresist coating on the polycrystalline surface consisting of single crystals, suitable adjustment of the photoresist allows exposure of the peak portions of the peak shaped single crystals and automatic masking of the areas of grin boundaries. Thus, this method allows masking of the areas of the grain boundaries with a $SiO_2$ or $Si_3N_4$ layer without the photomask.

In the following there will be explained the formation of the junction and passivation of the grain boundaries.

On the thus obtained masked polycrystalline silicon surface, dopant impurity was introduced by ion implantation of $B^+$ under the conditions of 20 keV, $1 \times 10^{15}$ cm$^{-2}$, and, after photoresist stripping, annealing was conducted by radiant heating to activate the impurity and passivate the grain boundaries. Said radiant heating was conducted by the RTA (rapid thermal annealing) method for achieving the process within a short time. The process was conducted under the conditions of a temperature elevating rate of 50° C./sec., a temperature of 850° C., and a period of 10 sec. As an alternative, the junction can be formed, after photoresist stripping, by annealing for 30 minutes at 800° C., thereby activating the impurity. A Cr/Ag/Cr electrode was formed on the thus annealed polycrystalline silicon surface, and the voltage-current characteristics between said electrode and the substrate were investigated. The reverse saturation current (dark current) was less than $10^{-9}$ A/cm$^2$, and was reduced more than 10,000 times, in comparison with a junction formed by ion implantation without the masking of grain boundaries.

These data indicate that the above-explained process can exhibit adequate properties in the production of solar cells.

In the following the method of the present invention for producing solar cells will be clarified further by examples, but the present invention will by no means by limited by such examples.

EXAMPLE 1

On a Mo substrate of a thickness of 500 μm, Si was deposited by evaporation to a thickness of ca. 300 Å and was heat treated for 30 min. at 600° C. to obtain a silicide layer constituting the nucleation surface. Then a $SiO_2$ insulating layer of a thickness of 1000 Å, constituting the non-nucleation surface, was formed by an atmospheric pressure CVD apparatus, and was photolithographically etched to form square apertures of a size of a=1.2 μm (cf. FIG. 4A) arranged in a grating pattern with a pitch of 50 μm, thereby exposing the silicide nucleation surface 401. On such substrate, a polycrystalline thin silicon film, consisting of single crystals, was formed by LPCVD process under the conditions shown in Table 2.

TABLE 2

| Gas flow rate ratio (1/min.) | Substrate temp. (°C.) | Pressure (Torr) | Growth time (min.) |
|---|---|---|---|
| $SiH_2Cl_2/HCl/H_2 =$ | | | |

TABLE 2-continued

| Gas flow rate ratio (1/min.) | Substrate temp. (°C.) | Pressure (Torr) | Growth time (min.) |
|---|---|---|---|
| 0.53/2.0/100* | 960 | 100 | 20 |
| ↓ | ↓ | ↓ | ↓ |
| 0.53/1.6/100 | 960 | 100 | 50 |
| ↓ | ↓ | ↓ | ↓ |
| 0.53/2.0/100 | 1060 | 100 | 100 |

*$PH_3$ addition: $PH_3/SiH_2Cl_2 = 3 \times 10^{-4}$

On the thus obtained polycrystalline thin film, a $SiO_2$ film of a thickness of 100–200 Å was formed by thermal oxidation, and was photolithographically etched by photoresist coating thereon and with a photomask shown in FIG. 6A, whereby apertures were formed in the $SiO_2$ film while the grain boundaries were masked. Then $B^+$ dopant ions were implanted while the photoresist layer remained, and, after photoresist stripping, annealing was conducted to form the junction.

The solar cell was completed by forming, on the polycrystalline surface, a transparent conductive layer and a current-collecting electrode by vacuum evaporation.

The polycrystalline solar cell thus prepared without the junction in the areas of grain boundaries provided, in the measurement of current-voltage (I-V) characteristics under light irradiation of AM 1.5 (100 mW/cM$^2$) with a cell area of 0.36 cm$^2$, an open-circuit voltage of 0.50 V, a short circuit photocurrent of 28 mA cm$^2$, a fill factor of 0.68 and a conversion efficiency of 9.5%. It was therefore confirmed that a satisfactory solar cell with a high open-circuit voltage could be obtained by a polycrystalline thin silicon film formed on a non-monocrystalline substrate.

EXAMPLE 2

Figure 1:
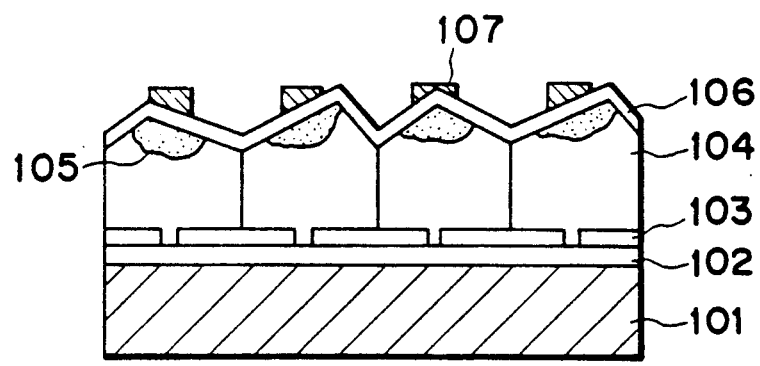
FIG. 1 is a cross-sectional view of a solar cell of the present invention.
Figure 2:
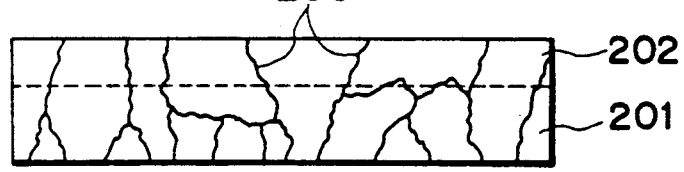
FIG. 2 is a cross-sectional view showing grain boundaries in a p-n junction of a conventional polycrystalline semiconductor.
Figure 3:
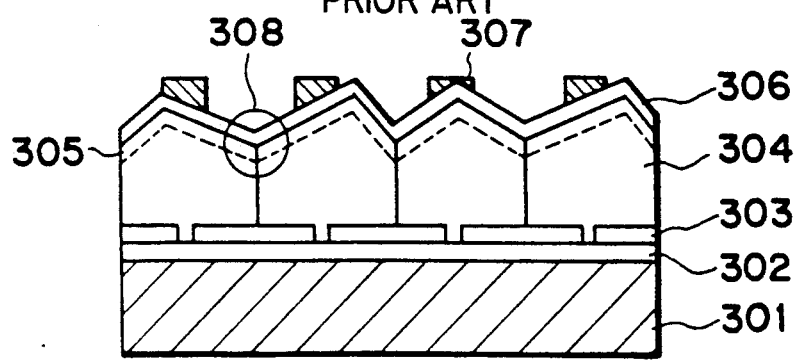
FIG. 3 is another cross-sectional view showing grain boundaries in a p-n junction of a conventional polycrystalline semiconductor.

A polycrystalline silicon PIN solar cell as shown in FIG. 1 was prepared on a metal substrate in the manner explained above, via the steps shown in FIGS. 8A to 8F. The metal substrate consisted of a Mo plate with a thickness of 0.9 mm, on which silicon was deposited at a thickness of 500 Å by thermal decomposition of $SiH_4$ at 630° C. in the LPCVD apparatus shown in FIG. 7. Thereafter the same temperature was maintained for 30 minutes to obtain a silicide layer.

Then a $Si_3N_4$ insulating layer of a thickness of 1000 Å was deposited in a similar LPCVD apparatus on said silicide layer, and was dry etched to form square apertures with a size of a=1 μm, arranged in a grating pattern with a pitch b=100 μm, whereby non-nucleation surfaces ($Si_3N_4$) and nucleation surfaces (silicide) were formed.

Then, in the LPCVD apparatus shown in FIG. 7, selective crystal growth was conducted under the conditions shown in Table 3 to obtain a continuous thin film consisting of polycrystalline silicon. The silicon grain size and the film thickness were both about 100 μm.

TABLE 3

| Gas flow rate ratio (1/min.) | Substrate temp. (°C.) | Pressure (Torr) | Growth time (min.) |
|---|---|---|---|
| $SiH_2Cl_2/HCl/H_2 =$ | | | |
| 0.53/2.0/100* | 950 | 100 | 20 |
| ↓ | ↓ | ↓ | ↓ |
| 0.53/1.6/100 | 950 | 100 | 50 |
| ↓ | ↓ | ↓ | ↓ |
| 0.53/2.0/100 | 1060 | 100 | 130 |
| ↓ | ↓ | ↓ | ↓ |

TABLE 3-continued

| Gas flow rate ratio (1/min.) | Substrate temp. (°C.) | Pressure (Torr) | Growth time (min.) |
|---|---|---|---|
| 0.53/0.5/100 | 1060 | 100 | 30 |

*PH$_3$ addition: PH$_3$/SiH$_2$Cl$_2$ = 3 × 10$^{-4}$

On the thus obtained polycrystalline silicon layer, Si$_3$N$_4$ was deposited with a thickness of 100 Å, and was subjected to the masking of grain boundaries, utilizing photoresist and a photomask shown in FIG. 6A. After the formation of apertures in the Si$_3$N$_4$ layer, B$^+$ dopant ions were implanted under the conditions of 20 keV and 1 × 10$^{15}$ cm$^{-2}$ while the photoresist still remained, and a p$^+$ layer was formed by annealing for 30 minutes at 800° C. after the stripping of photoresist. Finally, on said p$^+$ layer, there were formed an ITO transparent conductive layer (820 Å) and a current-collecting electrode (Cr (200 Å)/Ag (1 μm)/Cr (400 Å)) by electron beam evaporation.

The thus prepared polycrystalline silicon solar cell provided, in the measurement of I-V characteristics under light irradiation of AM 1.5 (100 mW/cm$^2$), with a cell area of 0.36 cm$^2$, an open-circuit voltage of 0.51 V, a short circuit current of 29 mA/cm$^2$, a fill factor of 0.70, and an energy conversion efficiency of 10.3%. In this manner, a polycrystalline solar cell of satisfactory characteristics could be obtained with a non-monocrystalline substrate.

EXAMPLE 3

A polycrystalline p$^{30}$n$^-$n$^+$ solar cell was prepared in a similar manner as in the second example. Silicon was deposited on a Mo substrate as explained above, and was converted into a silicide layer. SiO$_2$ was deposited at a thickness of 1000 Å with an atmospheric pressure CVD apparatus and was photolithographically patterned to form an array of apertures of a = 1.2 μm, with a pitch of b = 50 μm. Then, selective crystal growth was conducted in the LPCVD apparatus shown in FIG. 7 under the continuous growing conditions shown in Table 4 to obtain a continuous polycrystalline thin silicon film. During the selective crystal growth under the conditions of Table 4, doping was conducted by introducing a small amount of impurity, which consisted of PH$_3$ added in a ratio of 2 × 10$^{-6}$ with respect to raw material gas SiH$_2$Cl$_2$. The grain size and thickness of the thus obtained silicon film were both ca. 50 μm.

Then, on the surface of thus obtained polycrystalline thin silicon film, consisting of a group of peaked single crystals, a SiO$_2$ film of a thickness of 100 Å was formed by thermal oxidation, and photoresist with suitably adjusted viscosity was coated thereon, whereby only the peak portions of the peaked single crystal were left exposed by said photoresist. In order to expose only the peaks and the vicinity thereof, the viscosity of the photoresist has to be regulated according to the height of the surface irregularities, related to the dimension b, of the peak-shaped single crystals.

TABLE 4

| Gas flow rate ratio (1/min.) | Substrate temp. (°C.) | Pressure (Torr) | Growth time (min.) |
|---|---|---|---|
| SiH$_2$Cl$_2$/HCl/H$_2$ = 0.53/2.0/100* | 950 | 100 | 20 |
| ↓ | ↓ | ↓ | ↓ |
| 0.53/1.6/100** | 950 | 100 | 40 |

TABLE 4-continued

| Gas flow rate ratio (1/min.) | Substrate temp. (°C.) | Pressure (Torr) | Growth time (min.) |
|---|---|---|---|
| ↓ | ↓ | ↓ | ↓ |
| 0.53/2.0/100** | 1060 | 100 | 90 |
| ↓ | ↓ | ↓ | ↓ |
| 0.53/0.5/100** | 1060 | 100 | 10 |

*PH$_3$ addition: PH$_3$/SiH$_2$Cl$_2$ = 3 × 10$^{-4}$
**PH$_3$ addition: PH$_3$/SiH$_2$Cl$_2$ = 2 × 10$^{-6}$ After the exposed SiO$_2$ was etched with aqueous HF solution, aluminum was deposited at a thickness of 600 Å by vacuum evaporation on the polycrystalline silicon still bearing photoresist thereon, in order to form a p$^+$ layer. Then the photoresist was stripped to lift off the aluminum, leaving the aluminum on the peak portions of the peak-shaped single crystals.

Then the p$^+$ layer was formed by a RTA (rapid thermal annealing) process, conducted for 15 seconds at 800° C.

Finally, an ITO transparent conductive layer of a thickness of ca. 900 Å, serving also as an antireflection film, was formed by electron beam evaporation, and a Cr current-collecting electrode of a thickness of 1 μm was formed thereon by vacuum evaporation.

The thus prepared polycrystalline p$^+$n$^-$n$^+$ solar cell provided, in the measurement of I-V characteristics under light irradiation of AM 1.5 and with a cell area of 0.16 cm$^2$, an open-circuit voltage of 0.53 V, a short circuit photocurrent of 28 mA/cm$^2$, a fill factor of 0.69 and an energy conversion efficiency as high as 10.2%.

EXAMPLE 4

A p$^+$ μc-Si/polycrystalline heterogeneous solar cell was prepared in a similar manner as in the second and third examples. On a Cr substrate, a silicon layer of a thickness of 400 Å was deposited by decomposition of SiH$_4$ in a plasma CVD process, and was converted into silicide by annealing for 30 minutes at 500° C.

Then a SiO$_2$ film of 800 Å was deposited on the silicide layer by atmospheric pressure CVD, and was etched to form apertures with a size a = 1.2 μm and with a pitch b = 50 μm. Subsequently, selective crystal growth was conducted by a LPCVD process, under the conditions shown in Table 4, to obtain a polycrystalline silicon layer. FIGS. 16 to 22 illustrate the process for producing the present heterogeneous solar cell.

Figure 19:
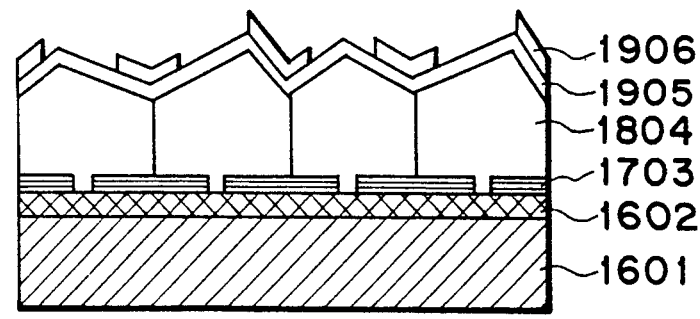

The surface of the polycrystalline silicon layer with peak shapes was thermally oxidized to obtain a SiO$_2$ film 1905 of a thickness of 150 Å. Then photoresist 1906 was coated thereon and processed as in the second example with a photomask shown in FIG. 6A, thereby masking the grain boundaries (FIG. 19).

Figure 20:
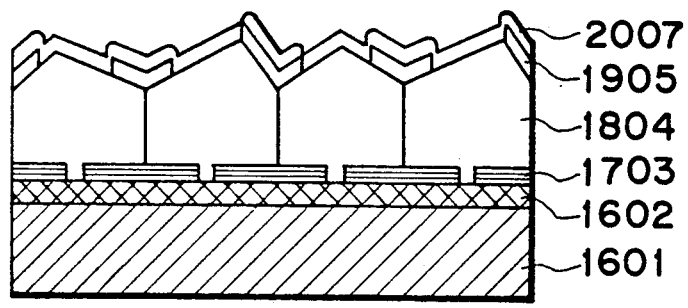

Then the SiO$_2$ film was etched to form the apertures therein, and the photoresist was removed with stripper. Then, on the polycrystalline silicon film, a p-type μc-Si film 2007 of a thickness of 200 Å was deposited under the conditions shown in Table 5 (FIG. 20). In this state, the dark conductivity of said Si film was about 10$^1$ S·cm$^{-1}$.

TABLE 5

| Gas flow rate ratio | Substrate temp. | Pressure | Discharge power |
|---|---|---|---|
| SiH$_4$/H$_2$ = 1 cc/20 cc B$_2$H$_6$/SiH$_2$ = 2.0 × 10$^{-3}$ | 250° C. | 0.5 Torr | 20 W |

Figure 21:
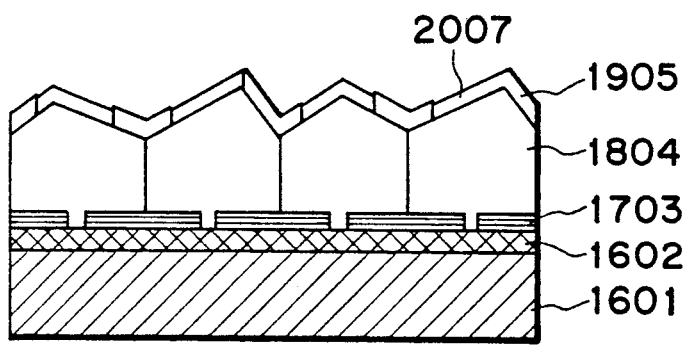

After the deposition of μc-si layer 2007, it is patterned by coating photoresist of the opposite (negative) type on the polycrystalline silicon and employing the photomask shown in FIG. 6A or a photomask with slightly larger apertures, in alignment with the apertures of the $SiO_2$ film (FIG. 21). In this manner a p-n junction is formed on the surface of the peaked polycrystalline silicon film, only in the apertures of the $SiO_2$ film.

The, an ITO transparent conductive layer 2208 was formed thereon with a thickness of ca. 850 Å by electron beam evaporation followed by formation of electrodes 2209.

The thus prepared p+ μc-Si/polycrystalline silicon heterogeneous solar cell provided, in the measurement of I-V characteristics under light irradiation of AM 1.5 with a cell area of 0.36 cm$^2$, an open-circuit voltage of 0.60 V, a short circuit photocurrent of 28.5 mA cm$^2$, a fill factor of 0.68, and an energy conversion efficiency as high as 11.6%. The open-circuit voltage is higher, by more than 0.1 V, than that in the case without masking of the grain boundaries (i.e. direct contact of p+ μc-Si layer with grain boundaries without formation of the $SiO_2$ layer on the polycrystalline surface).

EXAMPLE 5

A polycrystalline thin silicon film consisting of single crystals was grown by a LPCVD process under the conditions shown in Table 6, employing a substrate bearing nucleation surfaces consisting of a silicide layer and a non-nucleation surface consisting of a $SiO_2$ layer, in a similar manner to the above-explained masking process.

TABLE 6

| Gas flow rate ratio (1/min.) | Substrate temp. (°C.) | Pressure (Torr) | Growth time (min.) |
|---|---|---|---|
| $SiH_2Cl_2/HCl/H_2$ = | | | |
| 0.53/2.0/100* | 960 | 100 | 20 |
| ↓ | ↓ | ↓ | ↓ |
| 0.53/1.6/100 | 960 | 100 | 50 |
| ↓ | ↓ | ↓ | ↓ |
| 0.53/2/100 | 1060 | 100 | 130 |

*$PH_3$ addition: $PH_3/SiH_2Cl_2 = 3 \times 10^{-4}$

On the thus obtained polycrystalline thin film, $Si_3N_4$ was deposited with a thickness of 1 μm in a plasma CVD apparatus under the same conditions as in the above-explained masking process. Then photoresist was coated thereon with a thickness of about 1 μm, and grain boundary masking was conducted, employing the photomask shown in FIG. 6A, in the same manner as explained before. After aperture formation in the $Si_3N_4$, B+ dopant ions were implanted while the photoresist still remained, and, after photoresist stripping, annealing was conducted to form the junction and to passivate the grain boundaries. After the annealing, $Si_3N_4$ remaining on the grain boundaries was removed with hot phosphoric acid. Finally, a transparent conductive film and a current-collecting electrode were formed on the polycrystalline surface by vacuum evaporation, whereby a polycrystalline silicon solar cell without a junction on the grain boundaries was obtained.

Figure 15:
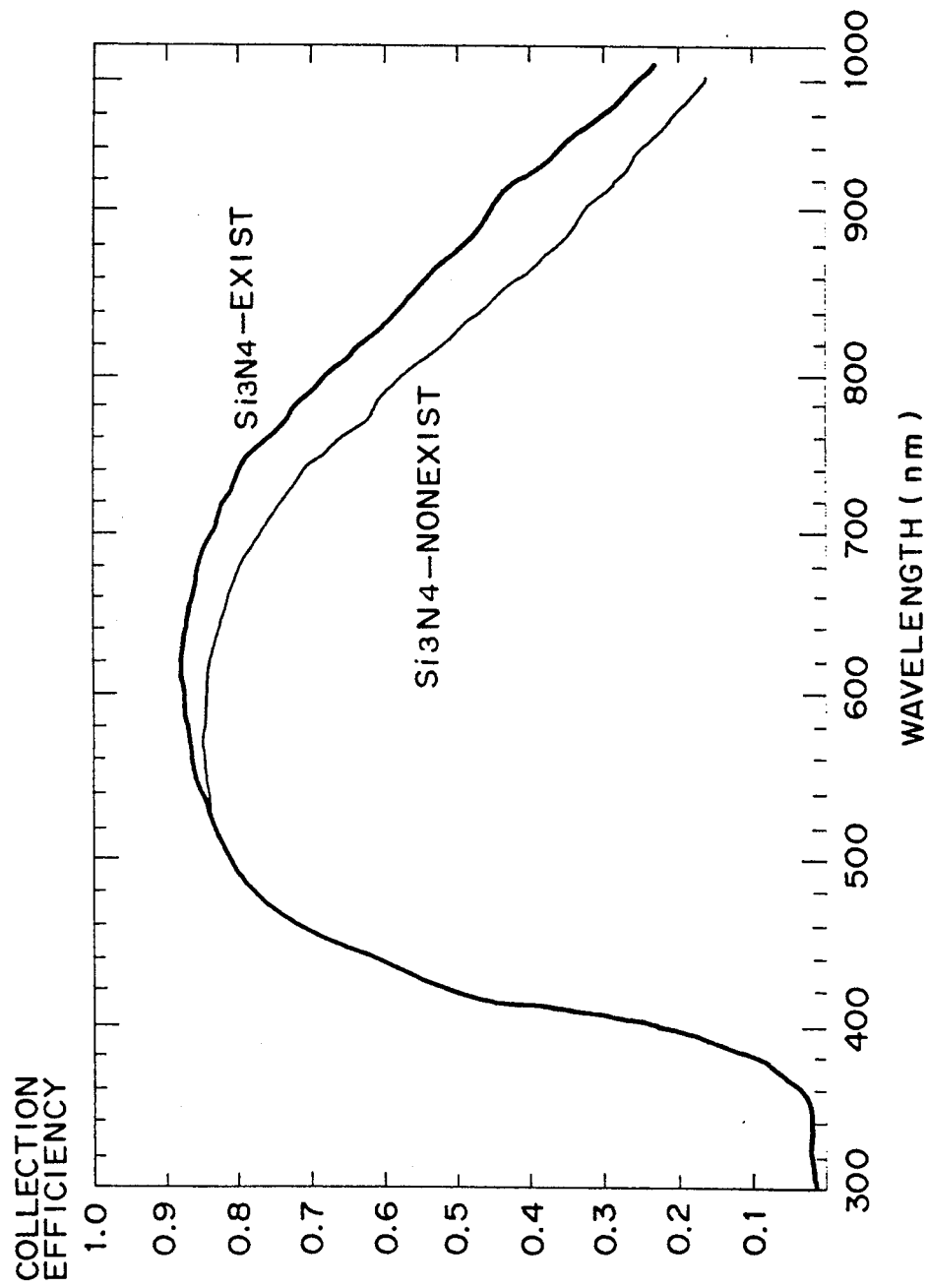
FIG. 15 is a chart showing the light absorption efficiency in the example 5 of the present invention.

The polycrystalline silicon solar cell thus prepared showed, in the measurement of current-voltage characteristics under light irradiation of AM 1.5 (100 mW/cm$^2$) with a cell area of 0.36 cm$^2$, an open-circuit voltage of 0.50 V, a short circuit photocurrent of 30 mA/cm$^2$, a fill factor of 0.71, and an energy conversion efficiency of 10.7%. In comparison with a solar cell prepared in the same process but without the deposition of $Si_3N_4$ (junction formation excluding the areas of grain boundaries only), the solar cell of the present example shows a larger photocurrent by 7.1%. This is due to an improved photosensitivity at the longer wavelength side as shown in FIG. 15, and this fact confirms effective passivation of the crystal grain boundaries with hydrogen.

EXAMPLE 6

A polycrystalline silicon PIN solar cell was prepared on a metal substrate 901 through a process shown in FIGS. 9 to 14, in a similar manner to the masking process explained above. The metal substrate 901 consisted of a Mo plate of 0.9 mm in thickness.

At first, on said substrate, Si was deposited with a thickness of 500 Å by thermal decomposition of $SiH_4$ at 630° C. in an LPCVD apparatus as shown in FIG. 7, and a silicide layer was obtained by maintaining the same temperature for 30 minutes. Then, on said silicide layer, a $Si_3N_4$ insulating layer of a thickness of 1000 Å was deposited in a similar LPCVD apparatus and dry etched to form apertures of a size a=1 μm, arranged in a grating pattern with a pitch b=100 μm, whereby there were obtained a non-nucleation surface ($Si_3N_4$) and nucleation surfaces (silicide). Subsequently, selective crystal growth was conducted under the continuous conditions shown in Table 7 in an LPCVD apparatus, thereby obtaining a continuous polycrystalline silicon film 1105.

TABLE 7

| Gas flow rate ratio (1/min.) | Substrate temp. (°C.) | Pressure (Torr) | Growth time (min.) |
|---|---|---|---|
| $SiH_2Cl_2/HCl/H_2$ = | | | |
| 0.53/2.0/100* | 950 | 100 | 20 |
| ↓ | ↓ | ↓ | ↓ |
| 0.53/1.6/100 | 950 | 100 | 50 |
| ↓ | ↓ | ↓ | ↓ |
| 0.53/2.0/100 | 1060 | 100 | 130 |
| ↓ | ↓ | ↓ | ↓ |
| 0.53/0.5/100 | 1060 | 100 | 30 |

*$PH_3$ addition: $PH_3/SiH_2Cl_2 = 3 \times 10^{-4}$

In the thus obtained continuous polycrystalline film, the grain size and film thickness were both ca. 100 μm. On said film 1105, $Si_3N_4$ was deposited with a thickness of 1 μm in a plasma CVD apparatus, under the conditions shown in Table 8.

TABLE 8

| Gas flow rate ratio | Substrate temp. | Pressure | Discharge power |
|---|---|---|---|
| $SiH_4$ = 100 sccm | 300° C. | 0.5 Torr | 700 W |
| $NH_3$ = 330 sccm | | | |
| $N_2$ = 1200 sccm | | | |

Then photoresist was coated and used for masking the grain boundaries, in the same manner as in the fifth example with the photomask shown in FIG. 6A, thereby locally exposing the $Si_3N_4$ layer. Then, while photoresist still remained, B+ dopant ions were implanted under the conditions of 20 keV and $1 \times 10^{15}$ cm$^{-2}$. After photoresist stripping, radiant annealing was conducted with an RTA apparatus, thereby forming a p+ layer and passivating the grain boundaries. The annealing was conducted with a temperature elevating rate of 50° C./sec. for 10 sec. at 850° C. and then 120 sec. at 550° C. After the remaining Si₃N₄ was removed with hot phosphoric acid, an ITO transparent conductive film (820 Å) and a current-collecting electrode (Cr (200 Å)/Ag (1 μm)/Cr (400 Å)) were formed on the continuous polycrystalline film by electron beam evaporation.

The thus prepared polycrystalline silicon solar cell showed, in the measurement of the I-V characteristics under light irradiation of AM 1.5 (100 mW/cm²) with a cell area of 0.36 cm², an open circuit voltage of 0.52 V, a short circuit photocurrent of 32 mA/cm², a curve factor of 0.70, and an energy conversion efficiency of 11.6%. In this manner, a polycrystalline solar cell of satisfactory characteristics could be obtained from a non-monocrystalline substrate.

EXAMPLE 7

A polycrystalline p+n−n+ solar cell was prepared in a similar manner as in example 6. On a Mo substrate, silicon was deposited and converted into a silicide layer. A SiO₂ layer of a thickness of 1000 Å was deposited thereon in an atmospheric pressure CVD apparatus and photolithographically etched to form apertures of a size a=1.2 μm, cyclically arranged with a pitch b=50 μm. Then selective crystal growth was conducted in an LPCVD apparatus as shown in FIG. 7 under the continuous growing conditions shown in Table 9, thereby obtaining a continuous polycrystalline thin silicon film, which was doped by introduction of dopant impurity during the growth.

TABLE 9

| Gas flow rate ratio (l/min.) | Substrate temp. (°C.) | Pressure (Torr) | Growth time (min.) |
|---|---|---|---|
| SiH₂Cl₂/HCl/H₂ = 0.53/2.0/100* | 950 | 100 | 20 |
| ↓ 0.53/1.6/100** | ↓ 950 | ↓ 100 | ↓ 50 |
| ↓ 0.53/2.0/100** | ↓ 1060 | ↓ 100 | ↓ 130 |
| ↓ 0.53/0.5/100** | ↓ 1060 | ↓ 100 | ↓ 30 |

*PH₃ addition: PH₃/SiH₂Cl₂ = 3 × 10⁻⁴
**PH₃ addition: PH₃/SiH₂Cl₂ = 2 × 10⁻⁶

Said dopant impurity consisted of PH₃, introduced in an amount of 2×10⁻⁶ with respect to the raw material gas SiH₂Cl₂. In the thus obtained thin silicon film, the grain size and the film thickness were both ca. 50 μm.

On the polycrystalline thin silicon film consisting of a group of peak-shaped single crystals, Si₃N₄ was deposited with a thickness of 1 μm in a plasma CVD apparatus, and photoresist with adjusted viscosity was coated thereon to expose the peak portions of said single crystals. In order to expose the peaks and the surrounding areas only, the viscosity of photoresist was regulated according to the height of the surface irregularities (related to the dimension b) of said peak-shaped single crystals.

After the exposed portions of the Si₃N₄ layer were etched by reactive ion etching, an Al film of 600 Å was deposited by vacuum evaporation onto the polycrystalline silicon layer, while the photoresist still remained, in order to form a p+ layer. Thereafter the photoresist was stripped to lift off the aluminum, leaving the portions on the peaks of the single crystals. Then RTA treatment was conducted with a temperature elevating rate of 50° C./sec. for 15 sec. at 800° C. and then for 110 sec. at 550° C., thereby forming the p+ layer and passivating the grain boundaries. After the remaining Si₃N₄ was removed, an ITO transparent conductive film of ca. 900 Å, also serving as an antireflective film, was formed by electron beam evaporation, and a Cr current-collecting electrode of 1 μm in thickness was formed thereon by vacuum evaporation.

The thus obtained polycrystalline p+n−n+ solar cell showed, in the measurement of I-V characteristics under light irradiation of AM 1.5 with a cell area of 0.16 cm², an open-circuit voltage of 0.53 V, a short circuit photocurrent of 33 mA/cm², a fill factor of 0.72, and an energy conversion efficiency as high as 12.6%.

EXAMPLE 8

Figure 16:
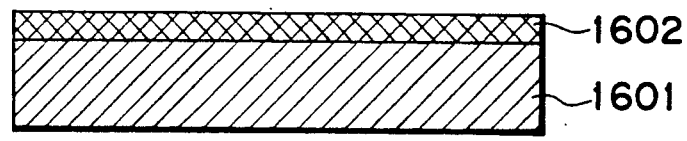
FIGS. 16 to 22 are schematic partial cross-sectional views showing, in succession, steps of an embodiment of the method of the present invention.
Figure 17:
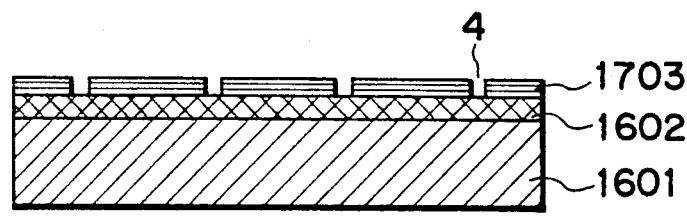
Figure 18:
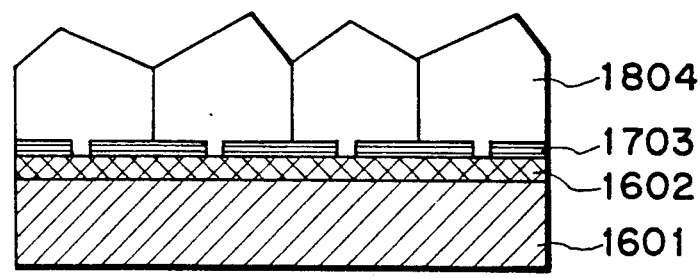

A p+ μc-Si/polycrystalline silicon heterogeneous solar cell was prepared, in a manner similar to the example 6, according to a process shown in FIGS. 16 to 22. On a Cr substrate, a silicon layer of 400 Å in thickness was deposited by decomposition of SiH₄ by a plasma CVD process, and was annealed for 30 minutes at 500° C. to obtain a silicide film. Then a SiO₂ film was deposited thereon with a thickness of 800 Å by an atmospheric pressure CVD process, and was etched to form apertures of a size a=1.2 μm and a pitch b=50 μm. Then selective crystal growth was conducted under the aforementioned conditions shown in Table 8, thereby forming a polycrystalline silicon layer (FIGS. 16 to 18).

On the thus obtained peak-shaped polycrystalline silicon, Si₃N₄ was deposited with a thickness of 1 μm in a plasma CVD apparatus, then photoresist was coated thereon and the masking of grain boundaries was conducted in the same manner as in example 6, utilizing a photomask shown in FIG. 6A (FIG. 19). Subsequently, apertures were formed in the Si₃N₄ layer by reactive ion etching, and the photoresist was removed with stripper. Then, on the polycrystalline silicon, a p-type μc-Si layer was deposited with a thickness of 200 Å in an ordinary plasma CVD apparatus, under the conditions shown in Table 10 (FIG. 21).

TABLE 10

| Gas flow rate ratio | Substrate temp. | Pressure | Discharge power |
|---|---|---|---|
| SiH₄/H₂ = 1 cc/20 cc B₂H₆/SiH₄ = 2.0 × 10⁻³ | 250° C. | 0.5 Torr | 20 W |

Figure 22:
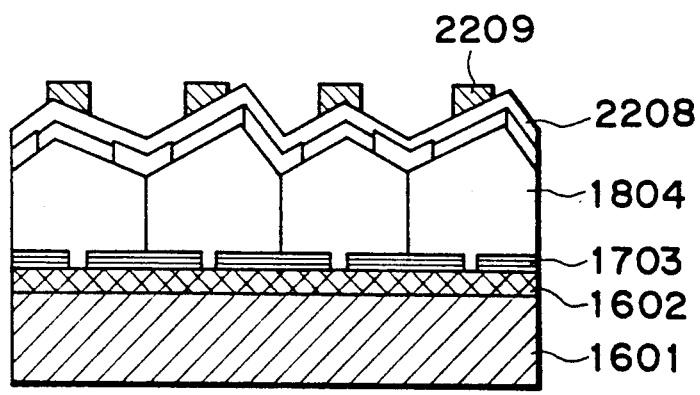

The dark conductivity of the μc-Si layer in this state was 10¹ S.cm⁻¹. After the deposition of said Si layer, photoresist of opposite (negative) type was coated on the peak-shaped polycrystalline silicon layer, and the μc-Si layer 2007 was patterned by employing the aforementioned photomask shown in FIG. 6A or a photomask with somewhat larger apertures, in alignment with the apertures in the Si₃N₄ layer (FIG. 22). In this manner, a p-n junction was formed on the surface of the peak-shaped polycrystalline silicon layer, only in the apertures formed in the Si₃N₄ layer. After the remaining Si₃N₄ was removed with hot phosphoric acid, an ITO transparent conductive layer 2208 with a thickness of ca. 850 Å was formed by electron beam evaporation, and a current-collecting electrode 2209 (Cr (200 Å)/Ag (1 μm)/Cr (400 Å)) was formed thereon (FIG. 22).

The p+ μc-Si/polycrystalline silicon solar cell thus obtained showed, in the measurement of the I-V characteristics under light irradiation of AM 1.5 with a cell area of 0.36 cm², an open-circuit voltage of 0.59 V, a short circuit photocurrent of 31 mA/cm², a fill factor of 0.7 and an energy conversion efficiency as high as 12.8%. Said open-circuit voltage was higher, by more than 0.1 V, than in the case without grain boundary masking (in which the p+ μc-Si layer is in direct contact with the grain boundaries, without formation of Si$_3$N$_4$ layer on the polycrystalline surface as in the above-described process).

Also, in the case of a liquid phase growth of a continuous polycrystalline film, employing Sn as a solvent, on a substrate bearing a non-nucleation surface and a plurality of small nucleation surfaces, there could be obtained a solar cell with similarly high open-circuit voltage and short circuit photocurrent, by at first saturating said solvent with Si, then gradually cooling the thus obtained solution to obtain a supersaturated state, immersing said substrate in said solution for a predetermined period for effecting the crystal growth, and subsequently forming the junction excluding the areas of the grain boundaries.

What is claimed is:

1. A polycrystalline silicon solar cell utilizing single crystals grown by selective crystal growth from small nucleation surfaces provided on a non-nucleation surface, wherein dangling bonds in the areas of crystal grain boundaries formed by mutual contact of said single crystals are terminated by hydrogen atoms and a semiconductor providing a photoelectromotive force is formed so as to exclude the areas of said crystal grain boundaries.

2. A method for producing a polycrystalline solar cell, comprising the steps of:
   1) forming a non-nucleation surface and a plurality of spaced apart nucleation surfaces on a substrate;
   2) selectively growing single crystals on the nucleation surfaces of said substrate to form a continuous polycrystalline film of one conductivity type;
   3) forming a masking material on said continuous polycrystalline film with apertures so as to exclude areas of crystal grain boundaries formed by mutual contact of said single crystals;
   4) forming a semiconductor junction in the portions of said single crystals exposed through said apertures of said masking material;
   5) removing said masking material; and
   6) forming a transparent conductive layer on said continuous polycrystalline film and a current collecting electrode on said transparent conductive material.

3. A method according to claim 2, wherein said masking material is composed of SiO$_2$ or Si$_3$N$_4$.

4. A method according to claim 3, wherein said Si$_3$N$_4$ contains hydrogen atoms in a concentration of not less than $10^{22}$ cm$^{-3}$.

5. A method according to claim 2, wherein said selective single crystal growth is conducted by a thermal CVD process.

6. A method according to claim 2, wherein said step of selectively growing single crystals is conducted by a liquid phase crystal growing process.

7. A method for producing a polycrystalline solar cell, comprising the steps of:
   1) forming a non-nucleation surface and a plurality of spaced apart nucleation surfaces on a substrate;
   2) selectively growing single crystals on the nucleation surfaces of said substrate to form a continuous polycrystalline film of one conductivity type;
   3) forming, on said continuous polycrystalline film, a material composed of silicon atoms, nitrogen atoms and hydrogen atoms with apertures so as to exclude areas of crystal grain boundaries formed by mutual contact of said single crystals, and introducing a dopant impurity of opposite conductivity type through said apertures into the exposed surfaces of said single crystals;
   4) effecting passivation of said grain boundaries with hydrogen atoms and forming a semiconductor junction in said single crystals; and
   5) forming a transparent conductive layer on said continuous polycrystalline film, and a current-collecting electrode on said transparent conductive layer.

8. A method according to claim 7, wherein the concentration of said hydrogen atoms is not less than $10^{22}$ cm$^{-3}$.

9. A method according to claim 7, wherein said material composed of silicon atoms, nitrogen atoms, and hydrogen atoms is formed by a plasma CVD process.

10. A method according to claim 7, wherein said apertures are formed by a photolithographic process.

11. A method according to claim 7, wherein said dopant impurity is P, As, Sb, B, Al, In or Ga.

12. A method according to claim 7, wherein said selective crystal growth is conducted by a thermal CVD process.

13. A method according to claim 7, wherein said step of effecting passivation and forming a semiconductor junction is conducted by radiant heating.

14. A method according to claim 7, wherein said step of selectively growing single crystals is conducted by a liquid phase crystal growing process.

* * * * *

UNITED STATES PATENT AND TRADEMARK OFFICE
CERTIFICATE OF CORRECTION

PATENT NO. : 5,279,686
DATED : January 18, 1994
INVENTOR(S) : SHOJI NISHIDA

Page 1 of 3

It is certified that error appears in the above-identified patent and that said Letters Patent is hereby corrected as shown below:

COLUMN 4

Line 20, "single the" should read
--single crystals solely on the--.
Line 47, "polycrystalline" should read
--polycrystalline film,--.

COLUMN 5

Line 8, "hydrogen containing" should read
--hydrogen-containing--.
Line 11, "hydrogen containing" should read
--hydrogen-containing--.

COLUMN 7

Line 44, "phase employ" should read
--phase growth process may employ--.

COLUMN 8

Line 52, "Also," should read --¶ Also,--.

UNITED STATES PATENT AND TRADEMARK OFFICE
CERTIFICATE OF CORRECTION

PATENT NO. : 5,279,686
DATED : January 18, 1994
INVENTOR(S) : SHOJI NISHIDA

It is certified that error appears in the above-identified patent and that said Letters Patent is hereby corrected as shown below:

COLUMN 11

Line 32, "$p^{30}n^-n^+$ solar cell" should read --$p^+n^-n^+$ solar cell--.

COLUMN 13

Line 1, "µc-si" should read --µc-Si--.
Line 9, "The," should read --Then--.

COLUMN 15

Line 9, "open circuit" should read --open-circuit--.

COLUMN 17

Line 27, "semiconductor" should read --semiconductor junction--.

UNITED STATES PATENT AND TRADEMARK OFFICE
CERTIFICATE OF CORRECTION

PATENT NO. : 5,279,686
DATED : January 18, 1994
INVENTOR(S) : SHOJI NISHIDA

Page 3 of 3

It is certified that error appears in the above-identified patent and that said Letters Patent is hereby corrected as shown below:

COLUMN 18

Line 33, "atoms is" should read --atoms in said material composed of silicon atoms, nitrogen atoms, and hydrogen atoms is--.

Signed and Sealed this

Twenty-third Day of August, 1994

Attest:

BRUCE LEHMAN

Attesting Officer     Commissioner of Patents and Trademarks